(12) United States Patent
Brodsky et al.

(10) Patent No.: US 9,325,086 B2
(45) Date of Patent: Apr. 26, 2016

(54) DOUBLING AVAILABLE PRINTED WIRING CARD EDGE FOR HIGH SPEED INTERCONNECT IN ELECTRONIC PACKAGING APPLICATIONS

(71) Applicant: International Business Machines Corporation, Armonk, NY (US)

(72) Inventors: William L. Brodsky, Binghamton, NY (US); Robert R. Genest, Poughkeepsie, NY (US); John J. Loparco, Poughkeepsie, NY (US); Michael T. Peets, Staatsburg, NY (US); John G. Torok, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/452,221

(22) Filed: Aug. 5, 2014

(65) Prior Publication Data
US 2016/0043484 A1    Feb. 11, 2016

(51) Int. Cl.
*H05K 1/14* (2006.01)
*H01R 11/01* (2006.01)
*H01R 12/71* (2011.01)

(52) U.S. Cl.
CPC .............. *H01R 11/01* (2013.01); *H01R 12/716* (2013.01)

(58) Field of Classification Search
USPC ............ 361/788, 801, 790, 810, 752, 679.32, 361/761; 439/65, 79, 541.5, 540.1, 74, 75, 439/78, 61, 62, 631, 660; 174/250
See application file for complete search history.

(56) References Cited

U.S. PATENT DOCUMENTS

| | | | |
|---|---|---|---|
| 4,655,518 A | 4/1987 | Johnson et al. | |
| 4,686,607 A * | 8/1987 | Johnson | H01R 12/716 361/761 |
| 4,703,394 A * | 10/1987 | Petit | H05K 7/1445 361/790 |
| 4,709,973 A * | 12/1987 | Waters | H01R 12/716 411/71 |
| 4,907,977 A * | 3/1990 | Porter | H05K 1/14 439/629 |
| 5,356,301 A | 10/1994 | Champion et al. | |
| 5,594,621 A * | 1/1997 | van Rumpt | G06F 1/184 361/679.32 |
| 5,860,819 A | 1/1999 | Northey et al. | |
| 5,926,378 A * | 7/1999 | DeWitt | G06F 13/409 361/788 |
| 6,147,871 A * | 11/2000 | DeWitt | G06F 13/409 361/752 |
| 6,371,773 B1 | 4/2002 | Crofoot et al. | |
| 6,392,142 B1 * | 5/2002 | Uzuka | H05K 1/14 174/541 |
| 6,529,386 B2 * | 3/2003 | Boe | H05K 7/1431 361/801 |
| 6,572,409 B2 | 6/2003 | Nitta et al. | |
| 6,976,886 B2 | 12/2005 | Winings et al. | |
| 7,108,556 B2 | 9/2006 | Cohen et al. | |
| 7,331,802 B2 | 2/2008 | Rothermel et al. | |
| 7,500,871 B2 | 3/2009 | Minich et al. | |
| 7,666,009 B2 | 2/2010 | Minich et al. | |
| 8,764,457 B2 * | 7/2014 | Chen | H05K 7/142 361/810 |
| 2002/0034068 A1 * | 3/2002 | Weber | H05K 7/023 361/790 |
| 2013/0005160 A1 | 1/2013 | Minich | |

* cited by examiner

*Primary Examiner* — Abdullah Riyami
*Assistant Examiner* — Harshad Patel
(74) *Attorney, Agent, or Firm* — Steven L. Bennett; Jack V. Musgrove (57) ABSTRACT

An interconnection assembly for a motherboard uses right-angle edge connectors attached to a bottom side of the motherboard, and vertical header connectors attached to the top side. The header connectors mate with a transition card assembly which includes a transition card having plated through holes that receive pins of the header connectors. Right-angle mezzanine connectors mounted on the transition card have pins that extend into the plated through holes from the top side. The edge connectors and mezzanine connectors both face forward in a common direction. The transition card has holes along a rear edge to retain pressed-in nuts for mounting to a stabilizing bezel. Instead of pins being part of the header connectors, connector caps may be provided with pins having first ends that extend into sockets of the header connectors and second ends that extend into the plated through holes of the transition card.

24 Claims, 4 Drawing Sheets

DOUBLING AVAILABLE PRINTED WIRING CARD EDGE FOR HIGH SPEED INTERCONNECT IN ELECTRONIC PACKAGING APPLICATIONS

BACKGROUND OF THE INVENTION

1. Field of the Invention

The present invention generally relates to connectors, and more particularly to an electrical interconnection for a card or printed circuit board along its edge.

2. Description of the Related Art

Many modern electronic devices and systems have a printed circuit board (PCB, also referred to as a printed wiring card) or similar planar substrate that is used to physically support circuit structures such as discrete electrical elements (resistors, capacitors, etc.) and integrated circuit chips (microprocessors, digital signal processors, etc.). A PCB also provides features for interconnecting these structures with one another or with external components. A typical PCB has signal traces or tracks formed on one or both surfaces (top and bottom) using a conductive material such as copper, with contact pins, tines, sockets, pads or strips at terminal ends of the traces (connection points). Components may be adhesively bonded or mechanically fastened to the PCB, and electrical connections may be completed using various technologies such as solder balls (e.g., controlled collapse chip connection, or "C4") or surface mount technology.

Computer systems in particular usually have a primary PCB referred to as a motherboard which supports the main system components (e.g., microprocessor(s) and memory) as well as ancillary components, and often have several other PCBs. Separable extensions of the motherboard are commonly referred to as a daughterboard. Specific functionalities can optionally be added in some computer systems using expansion cards having standardized connectors such as PCI (peripheral component interconnect) or ISA (industry standard architecture). Daughterboards are sometimes used in computers as an intermediate PCB to allow expansion cards to fit parallel to the motherboard, in order to maintain a smaller form factor, in which case they are also called riser cards, or risers. Other forms of PCBs may additionally be used, such as a midplane that allows daughter cards to be connected on both sides of the midplane, and can route signals between daughter cards connected on the same side or can cross-connect a daughter card on one side of the midplane with a daughter card on the other side.

Figure 1:
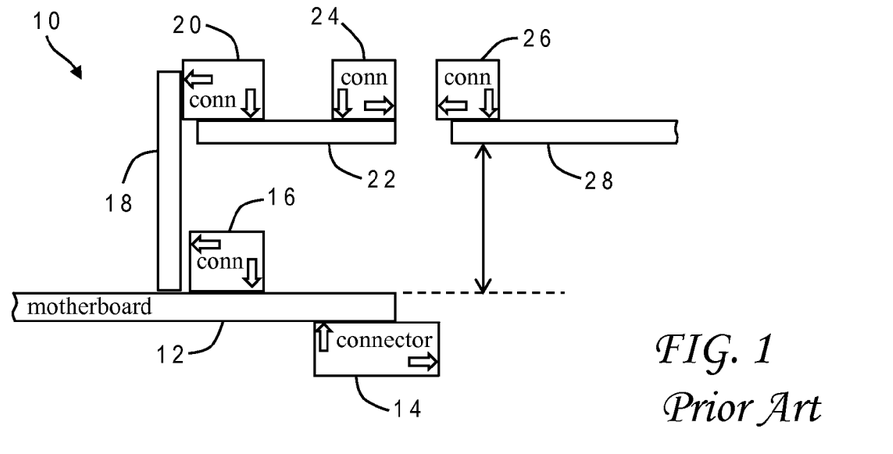
FIG. 1 is a conceptual side view of a conventional interconnection arrangement for expanding edge connections of a motherboard.

As electronic devices become more complicated, it becomes increasingly difficult to provide optimal interconnections between all of the components, particularly the motherboard which acts as a central hub for all of the computing activity. These systems are further experiencing increases in packaging density while requiring improved signal bandwidth and performance. There is accordingly a need to reduce packaging size and increase the signal density with in the packaging systems. This issue becomes more critical at the edges of a printed wiring board where a large number of signals may need to escape to create a computational network with other processes, interface with storage devices, interface with customer devices, etc. One interconnection solution 10 is depicted in FIG. 1. In this design, additional connector interfaces are employed to provide the necessary physical space translations to interconnect the required electronic assemblies along a single edge of the motherboard 12. A first edge connector 14 is disposed at the motherboard edge, mounted on the bottom side. Edge connector 14 provides one set of lateral connections for this edge of motherboard 12. A first right-angle connector 16 is attached to the top surface of motherboard 12, and provides a set of connections to a vertically-disposed intermediate board (riser) 18. As used herein, the term "right-angle connector" generally refers to connectors adapted to interconnect two boards which are perpendicular to one another, although it may describe other connections where one connection interface is vertically disposed while the other connection interface is horizontally disposed, without regard to the board orientations. A second right-angle connector 20 routes this set of connections from riser 18 to another intermediate board 22 which extends horizontally from riser 18 in the same direction as the edge of motherboard 12. A second edge connector 24 mounted on intermediate board 22 provides the second set of lateral connections for this edge, to interconnect with another edge connector 26 mounted on a daughterboard 28.

SUMMARY OF THE INVENTION

The present invention is generally directed to an electronic interconnection assembly comprising a motherboard having top and bottom surfaces and a forward edge, a right-angle edge connector mounted to the bottom surface of the motherboard proximate the forward edge providing electrical connections with connection points on the bottom surface and having a first interconnect facing forward, a header connector mounted to the top surface of the motherboard proximate the forward edge providing electrical connections with connection points on the top surface and having pins extending away from the top surface, a transition card having top and bottom surfaces and a plurality of plated through holes which receive pins of the header connector, and a right-angle mezzanine connector mounted to the top surface of the transition card having pins which are received by the plated through holes along the top surface of the transition card, and having a second interconnect facing forward. In the exemplary embodiment, the first and second interconnects face a common direction which is orthogonal to the forward edge and parallel to the motherboard. There may be multiple right-angle edge connectors, multiple header connectors, and multiple right-angle mezzanine connectors, all arranged in parallel rows. The transition card may be elongate with a rear edge and holes formed proximate the rear edge to retain pressed-in nuts for mounting the transition card to a stabilizing bezel. Instead of pins being part of the header connectors, connector caps may be provided with pins having first ends that extend into sockets of the header connectors and second ends that extend into the plated through holes of the transition card. In the illustrative embodiment the lower right-angle edge connectors are cable connectors (such as SMP cable connectors), and the upper right-angle mezzanine connectors are expansion card connectors (such as PCIe expansion card connectors). The electronic interconnection assembly can be implemented in a central electronic complex drawer for a computer system, with multiple assemblies provided along left and right sides of the forward edge of the motherboard.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

As noted in relation to FIG. 1, conventional solutions to expand interconnections along an edge of a motherboard or other printed wiring card require several extra connector interfaces to meet physical constraints. In the example of FIG. 1 there are three separable connector interfaces, between connector 16 and board 18, between board 18 and connector 20, and between connector 24 and connector 26. The inclusion of these added interfaces adversely affects both signal integrity and performance, exposing reliability risks and increasing cost. Additionally, this construction requires excess vertical spacing between motherboard 12 and daughterboard 28 in order to maintain adequate headroom between connector 16 and intermediate board 22. It would, therefore, be desirable to devise an improved interconnection arrangement for expanding edge connections in a very high density interconnection environment, which is low-profile but provides high-quality connections with high-density signal capacity. It would be further advantageous if the connectors used for the arrangement could be modular, and compatible with existing interconnection technologies.

Figure 2:
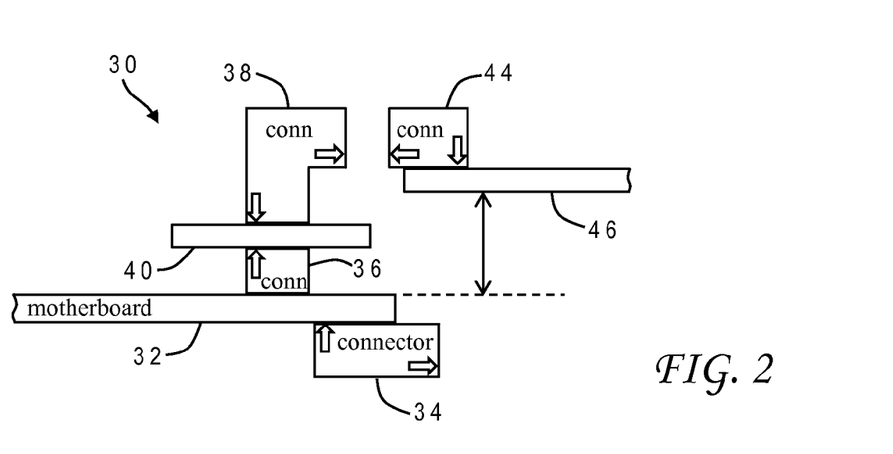
FIG. 2 is a conceptual side view of an electronic interconnection assembly for expanding edge connections of a motherboard in accordance with one embodiment of the present invention.
Figure 3:
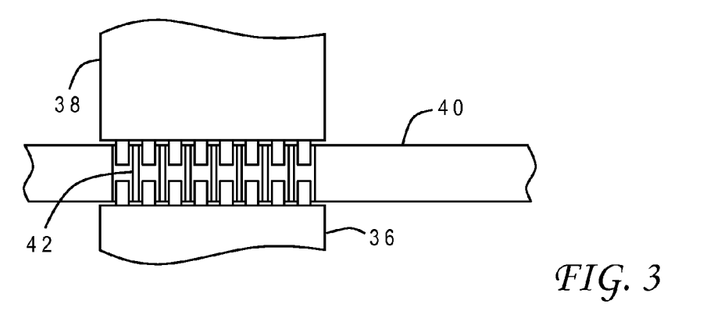
FIG. 3 is a detail view of the connection interface between a vertical header connector and a right-angle connector from FIG. 2, both of which have pins extending into common holes of a transition card in accordance with one embodiment of the present invention.

These objects are achieved in an electronic interconnection assembly which utilizes a vertical header connector mounted on a surface of the motherboard opposite a first right-angle edge connector, the vertical header connector mating with a second right-angle connector mounted to a transition card. This construction enables doubling of the input/output (I/O) function along one card edge for plugging a plurality of I/O devices and/or cables. A conceptual view for one implementation 30 of this novel interconnection assembly is seen in FIG. 2. A motherboard 32 has an edge connector 34 mounted to its bottom surface, providing a first set of edge connections. A vertical header connector 36 is mounted to the top surface of motherboard 32 and connects to a right-angle connector 38 mounted to a transition card 40. As seen in FIG. 3, two sets of compliant pins from connectors 36 and 38 can be inserted into opposite sides of through-holes 42 formed in transition card 40, and held in place by a friction fit. Through-holes 42 have inner walls formed of a conductive material, such as metal plating. Right-angle connector 38 is adapted to connect with the daughterboard connector 44, that is, another edge connector, mounted on daughterboard 46. Compared to the view of FIG. 1, this construction has only two separable connector interfaces, and achieves tighter vertical packaging. The result is increased edge connections with better electrical and mechanical performance. Right-angle connectors have electrical skew by row which mezzanine connectors do not have. Also, by eliminating the extra wiring traces on the intermediate PCBS this construction avoids more chances for impedance mismatch. The use of an extra right-angle connector in the design of FIG. 1 also means the mezzanine card is further from the process board due to the physical size of the connectors.

Figure 4:
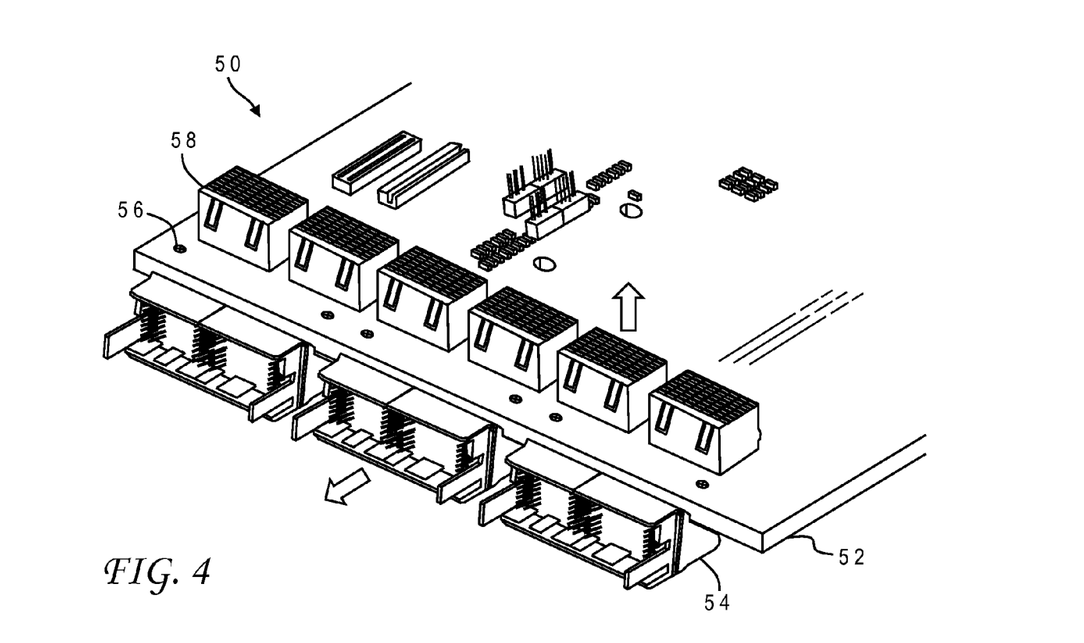
FIG. 4 is a front perspective view of a motherboard assembly illustrating the mounting of right-angle connectors along the bottom side of the motherboard near an edge and mounting of vertical header connectors along the top side of the motherboard near the edge in accordance with one embodiment of the present invention.

With further reference to FIG. 4, a more detailed implementation for a motherboard assembly 50 is shown. Motherboard assembly 50 includes a motherboard 52 (process board) which supports the primary components of a computer system such as one or more multi-core processing chips and one or more system memory chips, along with ancillary components. Motherboard 52 may be used alone or in combination with other motherboards as part of a central electronic complex (CEC) for the computer system. Three pairs of right-angle edge connectors 54 are attached in a row to the underside of motherboard 52 along a forward (straight) edge thereof, with the connection interface of edge connectors 54 generally facing the same direction as the normal to this forward edge, i.e., forward-facing interconnections. Edge connectors 54 can be affixed to motherboard using fasteners such as screws or bolts 56 which fit within holes formed in motherboard 52 and attach to a nut or tap in the connector body. Six vertical header connectors 58 can be similarly mounted in a row to the top side of motherboard 52. The connection interface of header connectors 58 generally face the same direction as the normal to the upper surface of motherboard 52, i.e., upwardly-facing interconnections. Although it is not necessary, header connectors 58 may be generally aligned with edge connectors 54. In other implementations these two sets of connectors may have a staggered arrangement. In the exemplary embodiment, header connectors 58 are mounted to the motherboard behind right-angle connectors 54 with respect to the forward edge of the motherboard (i.e., the connection points on the motherboard for the right-angle connectors are forward of the connection points on the motherboard for the header connectors).

Those skilled in the art will appreciate that terms such as "vertical", "horizontal", "bottom", "top" and the like are relative and, while they are very useful in conveying an understanding of the present invention with reference to a particular perspective, they are not meant to be construed in a limiting fashion. An interconnection assembly may have a different physical orientation (e.g., a vertically-disposed motherboard) but the invention may still be applied to such arrangements.

Connectors 54, 58 may be of conventional design. In the illustrative embodiment these connectors are part of the family of connectors sold by Molex Inc. of Lisle, Ill., under the Impact™ brand. In this implementation, connectors 54 have pins extending away from the forward edge of motherboard to mate with matching sockets of a first set of external connectors, while connectors 58 have sockets to receive matching pins of another set of external connectors. The connectors are generally rectangular in shape, and may have various tabs, latches, bosses, detents, slots, etc., for polarization, snap-fit, alignment or registration with features on the mating connector, etc. While it may be possible to remove connectors 54, 58 from motherboard 52, they are essentially permanently affixed, thereby forming the motherboard assembly 50. In addition to being physically mounted to motherboard 52, it is understood by those skilled in the art that connectors 54, 58 have electrical interconnections formed respectively along the bottom and top surfaces of motherboard 52 with conductive traces or terminals formed thereon, i.e., one set of terminals are interconnected using edge connector 54 and a different set of terminals are interconnected using header connector 58. Those electrical interconnections may for example be achieved using pins (not shown) generically referred to as a compliant pin assembly. Other connectors of various types, unrelated to the present invention, may also be attached to motherboard 52.

Figure 5:
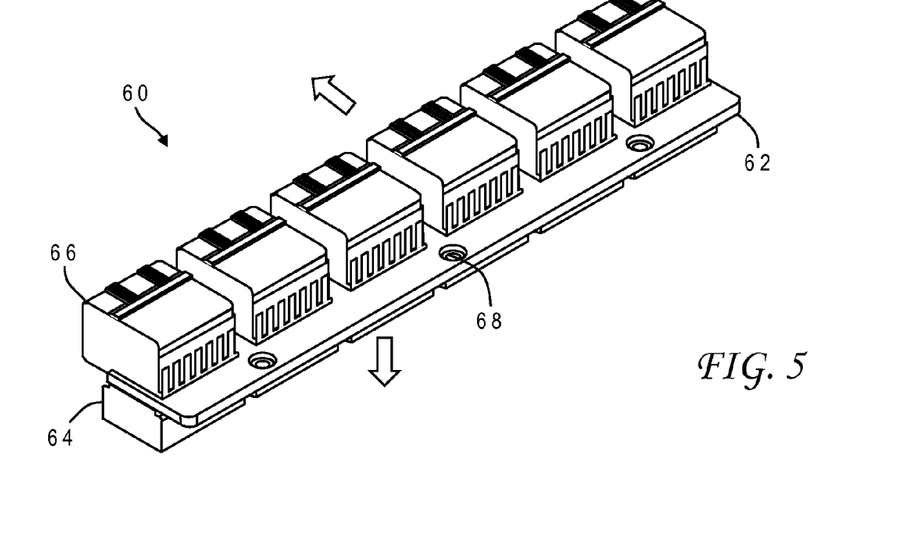
FIG. 5 is a rear perspective view of a transition card having right-angle connectors which mate with the vertical header connectors of the motherboard seen in FIG. 4 in accordance with one embodiment of the present invention.

FIG. 5 illustrates one example of a transition card assembly 60 which provides a mating interface for header connectors 58. Transition card assembly 60 includes a elongate transition card 62, and six fittings or caps 64 mounted in a row along the underside of transition card 62 adapted to engage respective header connectors 58, i.e., caps 64 have rectangular cavities which fit tightly over the tops (interconnect face) of header connectors 58. According to this embodiment a given header connector 58 has sockets which removably receive the ends of pins retained by a corresponding cap 64. The pins may be integrally formed with the cap as part of the molding process, and the other ends of these pins are pressed through the bottom surface of transition card 62 into plated through holes similar to that seen in FIG. 3. Transition card assembly 60 further includes six right-angle edge (mezzanine) connectors 66, and the through holes of transition card 62 also receive pins of mezzanine connectors 66 pressed through the top surface, again similar to FIG. 3. Transition card 62 preferably has holes formed therein along its back edge with pressed-in nuts 68 that allow the card to be stabilized for shock and vibration by mounting to a support structure, discussed further below in conjunction with FIG. 7.

Figure 6:
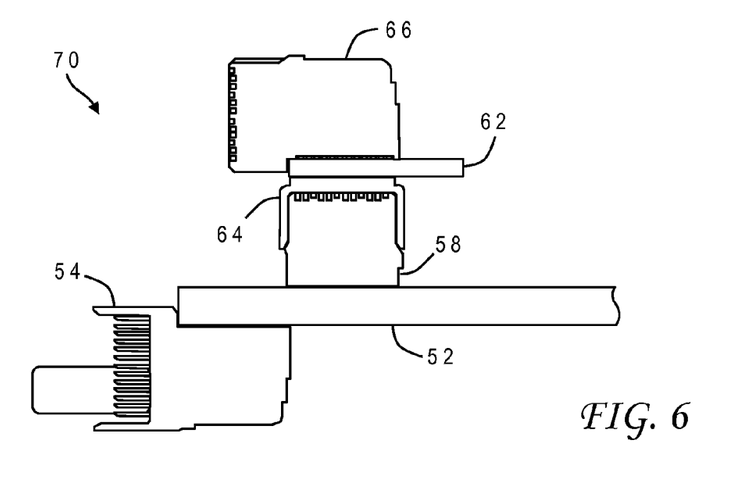
FIG. 6 is a side elevational view of the transition card of FIG. 5 attached to the motherboard of FIG. 4, i.e., the right-angle connectors are snapped into place over the vertical header connectors.

FIG. 6 depicts transition card assembly 60 plugged into motherboard assembly 50, forming an electronic interconnection assembly 70 in accordance with the present invention. The connection interface of mezzanine connectors 66 faces the same direction as the connection interface of edge connectors 54, i.e., forward-facing. In the illustrated embodiment this common direction is generally orthogonal to the forward edge of the motherboard but the connectors could be skewed slightly if desired; for example, the lower edge connectors could be angled slightly to the left and the upper edge connectors could be angled slightly to the right, but these two directions would still be generally parallel to the planes formed by the motherboard and transition card and would still be facing toward the forward area in front of the motherboard. Transition card assembly 60 thereby allows a second set of devices to be plugged along the same card edge as right-angle edge connectors 54 on the motherboard. In this particular embodiment the connection interface of mezzanine connectors 66 is slightly behind the forward edge of motherboard 52, but the connection interface of edge connectors 54 is slightly in front of the forward edge. In the depicted embodiment this connector face offset is a result of the plated through-hole patterns on the motherboard, i.e., because connector 58 is shifted behind connector 66, but it also facilitates the manual operation of installing the cables or expansion cards.

Electronic interconnection assembly 70 thus enables the doubling of the available I/O along a card edge which can be critical for high density applications (1.9 mm pitch). Assembly 70 achieves this benefit with a reduction in the number of electrical contact interfaces as compared to the prior art which would otherwise adversely impact system reliability, and further provides a low-profile structure while allowing the connection of different adapter technologies (e.g., cables and PCIe cards). This approach remains adaptable to industry available connector technologies with no (or minimal) electrical impact, and is easily provided with mechanical tolerance controls between the two electrical interfaces. Given that printed circuit boards typically have a manufacturing board thickness tolerance of +/−10% of its nominal value, this variation represents the largest portion of the assembly's tolerance loop. This contributor alone can prevent connectors from being plugged in the traditional manner illustrated in FIG. 1.

Figure 7:
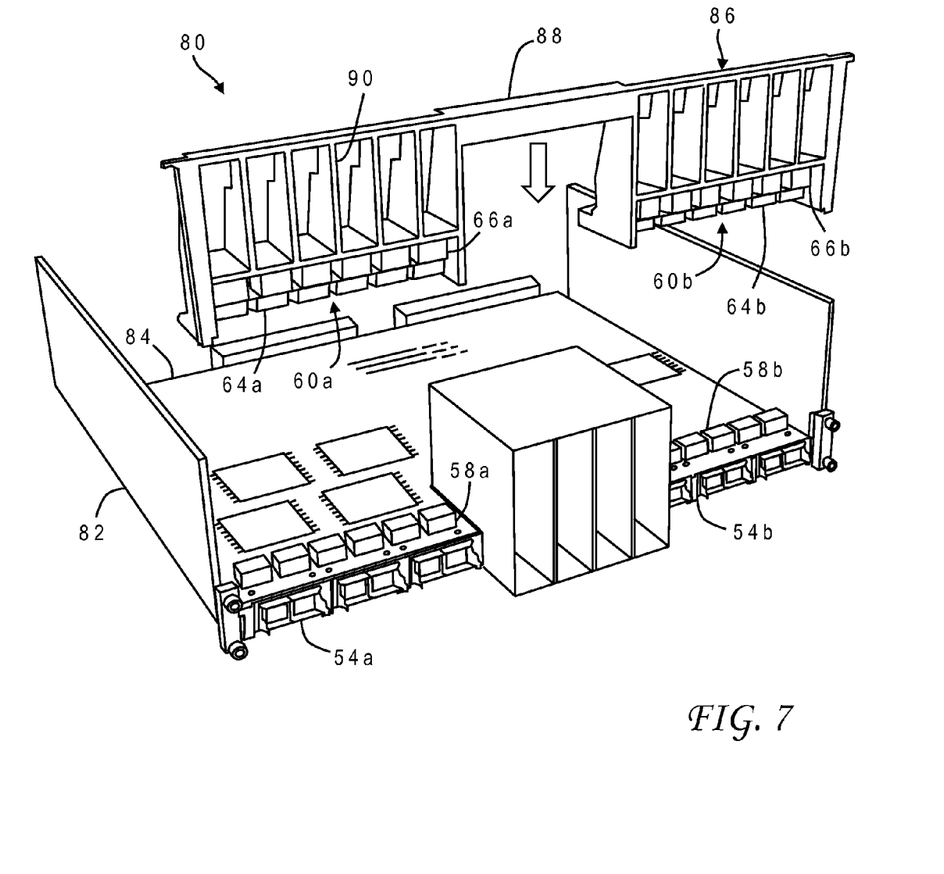
FIG. 7 is a perspective view of a central electronic complex drawer having a motherboard with two sets of edge connections, and a bezel assembly which supports two transition cards that are attached to respective sets of vertical header connectors in accordance with one embodiment of the present invention.

FIG. 7 illustrates a CEC drawer assembly 80 which uses multiple motherboard assemblies and transition card assemblies for a high-end computing system. Drawer assembly 80 includes a chassis or housing 82 which supports the components of the drawer, including a motherboard 84 which may be bolted to mounting features inside the housing walls. In this embodiment motherboard 84 has a central portion along the forward edge reserved to support other features such as a legacy I/O interface (not shown), creating two forward edges on left and right sides. A first set of right-angle edge connectors 54a are mounted at the forward edge on the left side to the bottom surface of motherboard 84, and a second set of right-angle edge connectors 54b are mounted at the forward edge on the right side to the bottom surface. A first set of vertical header connectors 58a are mounted at the forward edge on the left side to the top surface of motherboard 84, and a second set of vertical header connectors 58b are mounted at the forward edge on the right side to the top surface. Accordingly, edge connectors 54a and header connectors 58a are used to interconnect a first set of circuit traces of motherboard 84 (for CPUs or other modules on the left side of motherboard 84) terminated proximate the left edge with a first set of external devices or cables, and edge connectors 54b and header connectors 58b are used to interconnect a second set of circuit traces of motherboard 84 (for CPUs/modules on the right side of motherboard 84) terminated proximate the right edge with a second set of external devices or cables.

In this implementation an I/O bezel 86 is used to stabilize two transition card assemblies 60a, 60b that respectively engage header connectors 58a, 58b. Bezel 86 is preferably integrally formed such as by injection molding although it could constitute separable parts, and has a central cutout to accommodate the centrally located features of motherboard 84, forming a handle portion 88. Item 88 connects the left and right sections of the bezel above the legacy I/O adaptor section of the drawer. Transition card assemblies 60a, 60b are mounted to respective horizontal shelves or other mounting features formed along lower left and right sections of bezel 86 using the previously mentioned nuts that are press fit into holes formed in the transition cards, and matching bolts or other fasteners. Transition card assemblies 60a, 60b are generally parallel and aligned with one another. The length of bezel 80 is approximately equal to the interior width of chassis 82 so it fits snugly between the sidewalls which facilitates proper registration of the transition card assemblies in spaced relation as bezel 86 is lowered over motherboard 84 and fastened to the chassis. Motherboard 84 is attached to chassis 82 such that header connectors 58a, 58b are at known (predetermined) locations within the geometry of CEC drawer 80. Thus, when bezel 86 is fully lowered, the underside connector fittings 64a, 64b of the card assemblies operatively mate with header connectors 58a, 58b to form two separate electronic interconnection assemblies for the two edge sections of motherboard 84. Bezel 86 may have interior walls or fins 90 which partition the drawer space to accommodate portions of the various expansion cards or other attached devices.

Any connector formats may be used with the invention, but in the specific embodiment of FIG. 7 edge connectors 54a, 54b are symmetric multiprocessing bus (SMP) connectors for cables and mezzanine connectors 66a, 66b are PCIe connectors for expansion cards. Placing the SMP connectors at the underside of the motherboard precludes the SMP cables from hanging in front of the PCIe cards which are serviced more often.

An electronic interconnection assembly in accordance with the present invention may be deployed in different manners depending upon the particular configuration desired. For the exemplary embodiment of FIG. 7, the following installation procedure is deemed advantageous. First, transition card assemblies 60a, 60b are carefully placed on the mating connectors 58a, 58b, and the transition card assemblies are gently pushed down to slightly engage the connectors. Bezel 86 is lowered toward motherboard 84 while aligning two guide holes in bezel 86 with corresponding guide pins until the bezel is almost seated against the transition card assemblies. Screws are placed into the holes of the bezel and through the motherboard, and fastened (torqued) to a stiffener assembly (not shown). Three additional screws are used on each side of the bezel to fasten the transition card assemblies to the bezel so the cards become seated along the bottom side of the shelves of the bezel. Left and right side PCIe cage assemblies (not shown) are placed over pins of the bezel and fastened using additional screws. The PCIe cage assemblies have channels formed therein for receiving respective PCIe expansion cards, such that the channels are aligned with respective mezzanine connectors when the cage assemblies are attached to the CEC drawer. The SMP cable assemblies can then be plugged into connectors 54a, 54b, and expansion cards attached by sliding them into a cage assembly until the expansion card connector engages a connector 66a, 66b.

Since the controlling surfaces used for this design are the top of the motherboard and the top of the transition card, this methodology removes the motherboard thickness from the tolerance loop. The distance that the transition card is nominally unplugged is preferably slightly greater than the mechanical tolerance to allow the mating devices to be reliably plugged without connector stubbing. The amount that the card is unplugged is well within the wipe on the connector.

Conventional materials may be used for the motherboard, the transition card, and the various connectors. The dimensions of an electronic interconnection assembly constructed in accordance with the present invention can vary considerably depending on application. For the embodiment depicted in FIG. 7, the following approximate dimensions are considered exemplary. Motherboard 84 is 465.8 mm×586 mm and 6.46 mm thick, and each forward edge section (left/right) is about 209 mm long. Vertical header connectors 58a, 58b are 19.4 mm×26.5 mm×28.2 mm. The transition cards are 29 mm×194.8 mm and 3 mm thick. The electronic interconnection assemblies of FIG. 7 can achieve edge connection pin densities in the range of 12.6 to 19 contacts per millimeter.

The present invention accordingly enables doubling of the I/O function along one card edge for plugging a plurality of devices, with fewer connection interfaces leading to better signal integrity, tighter vertical packaging, and fewer parts. Not only is the I/O count doubled, but they can be defined for different busses and signaling requirements. The designs described herein possess superior tolerance control for stacked I/O interfaces along one card edge, and offer improved flexibility in design. Providing a separable connection interface also eases overall CEC drawer rework. The bezel structure further imparts better mechanical support for the mezzanine connectors.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention has been described in the context of a motherboard, but it is applicable to a daughterboard, card, backplane, or generally any type of PCB, i.e., any substrate of any shape or size that has at least one planar portion with an edge, and not just for a CEC but for any electronic device, including peripheral devices such as an expansion card, or miniaturized devices. It is therefore contemplated that such modifications can be made without departing from the spirit or scope of the present invention as defined in the appended claims.

What is claimed is:

1. An electronic interconnection assembly comprising:
    a first circuit board having first and second opposing surfaces and at least one edge defining a forward area in front of said circuit board;
    a first right-angle connector mounted to said first surface of said first circuit board proximate said edge, providing electrical connections with a first plurality of connection points on said first surface of said first circuit board, and having a first interconnect facing toward said forward area;
    a header connector mounted to said second surface of said first circuit board proximate said edge, providing electrical connections with a second plurality of connection points on said second surface of said first circuit board, and having a first plurality of pins extending away from said second surface of said first circuit board;
    a second circuit board having first and second opposing surfaces and a plurality of plated through holes which receive said first plurality of pins along said first surface of said second circuit board, wherein said first and second circuit boards are generally parallel; and
    a second right-angle connector mounted to said second surface of said second circuit board having a second plurality of pins which are received by said plated through holes along said second surface of said second circuit board, and having a second interconnect facing toward said forward area.

2. The electronic interconnection assembly of claim 1 wherein said first interconnect and said second interconnect faces a common direction which is generally orthogonal to said edge and generally parallel to a plane formed by said first circuit board.

3. The electronic interconnection assembly of claim 1 wherein said header connector is mounted to said first circuit board behind said first right-angle connector with respect to said edge.

4. The electronic interconnection assembly of claim 1 wherein:
    a first forward face of said first interconnect is located in front of said edge; and
    a second forward face of said second interconnect is located behind said edge.

5. The electronic interconnection assembly of claim 1 wherein:
said first right-angle connector is one of a first plurality of right-angle connectors mounted to said first surface of said first circuit board proximate said edge;
said header connector is one of a plurality of header connectors mounted to said second surface of said first circuit board proximate said edge; and
said second right-angle connector is one of a second plurality of right-angle connectors mounted to said second surface of said second circuit board.

6. The electronic interconnection assembly of claim 5 wherein said second circuit board is generally elongate and has a rear edge, with a plurality of holes formed therein proximate said rear edge which retain pressed-in nuts for mounting said second circuit board to a support structure.

7. An electronic interconnection assembly comprising:
a first circuit board having first and second opposing surfaces and at least one edge defining a forward area in front of said circuit board;
a first right-angle connector mounted to said first surface of said first circuit board proximate said edge, providing connections with a first plurality of connection points on said first surface of said first circuit board, and having a first interconnect facing toward said forward area;
a header connector mounted to said second surface of said first circuit board proximate said edge, providing connections with a second plurality of connection points on said second surface of said first circuit board, and having a plurality of sockets facing away from said second surface of said first circuit board;
a second circuit board having first and second opposing surfaces and a plurality of plated through holes, said second circuit board being generally parallel to said first circuit board;
a connector cap mounted to said first surface of said second circuit board, said connector cap retaining a first plurality of pins having first and second ends, said first ends being removably received by said sockets of said header connector, and said second ends being received by said plated through holes along said first surface of said second circuit board, said connector cap engaging said header connector; and
a second right-angle connector mounted to said second surface of said second circuit board having a second plurality of pins which are received by said plated through holes along said second surface of said second circuit board, and having a second interconnect facing toward said forward area.

8. The electronic interconnection assembly of claim 7 wherein said first interconnect and said second interconnect face a common direction which is generally orthogonal to said edge and generally parallel to said first and second circuit boards.

9. The electronic interconnection assembly of claim 7 wherein:
said first right-angle connector is one of a first plurality of right-angle connectors mounted to said first surface of said first circuit board proximate said edge in a first row;
said header connector is one of a plurality of header connectors mounted to said second surface of said first circuit board proximate said edge in a second row;
said connector cap is one of a plurality of connector caps mounted to said first surface of said second circuit board in a third row which engage said plurality of header connectors; and
said second right-angle connector is one of a second plurality of right-angle connectors mounted to said second surface of said second circuit board in a fourth row which generally overlaps said second and third rows.

10. The electronic interconnection assembly of claim 9 wherein said second circuit board is generally elongate in a direction of said rows and has a rear edge, and further comprising a stabilizing bezel wherein said second circuit board is affixed along its rear edge to said stabilizing bezel.

11. A card edge interconnection assembly comprising:
a motherboard having first and second opposing surfaces and at least one straight forward edge;
a plurality of right-angle edge connectors mounted to said first surface of said motherboard in a first row proximate said forward edge and parallel thereto, each right-angle edge connector providing electrical connections with a corresponding set of first connection points on said first surface of said motherboard, and having a first interconnect facing away from said forward edge in a direction which is generally orthogonal to said forward edge and generally parallel to said motherboard;
a plurality of header connectors mounted to said second surface of said motherboard in a second row generally parallel to said first row proximate said forward edge and behind said right-angle edge connectors, each header connector providing electrical connections with a corresponding set of second connection points on said second surface of said motherboard, and having a plurality of sockets facing away from said second surface of said motherboard;
a transition card having first and second opposing surfaces and sets of plated through holes, said transition card disposed generally parallel to said motherboard;
a plurality of connector caps mounted to said first surface of said transition card in a third row generally parallel to said first and second rows, each connector cap retaining a plurality of first pins having first and second ends, said first ends being received by sockets of a corresponding one of said header connectors, and said second ends being received by a corresponding one of said sets of plated through holes along said first surface of said transition card, said connector caps respectively engaging said header connectors; and
a plurality of right-angle mezzanine connectors mounted to said second surface of said transition card, each right-angle mezzanine connector having a plurality of second pins which are received by a corresponding one of said sets of plated through holes along said second surface of said transition card, and having a second interconnect facing the direction which is generally orthogonal to said forward edge and generally parallel to said motherboard.

12. The card edge interconnection assembly of claim 11, wherein:
a first forward face of said first interconnect is located in front of said forward edge; and
a second forward face of said second interconnect is located behind said forward edge.

13. The card edge interconnection assembly of claim 11 wherein a given one of said header connectors is aligned with a corresponding one of said right-angle edge connectors.

14. The card edge interconnection assembly of claim 11 wherein:
said motherboard is generally horizontal, with said first surface of said motherboard being a bottom surface and said second surface of said motherboard being a top surface;

said right-angle edge connectors are cable connectors; and
said right-angle mezzanine connectors are expansion card connectors.

15. A bezel for an electronic interconnection assembly comprising:
a handle portion;
a lower portion attached to said handle portion; and
a transition card assembly attached to said lower portion, said transition card assembly including
a generally horizontal, elongate transition card having a bottom surface, a top surface, and a plurality of sets of plated through holes,
a plurality of connector caps mounted to said bottom surface in a row, each connector cap retaining a plurality of first pins having first and second ends, said first ends extending downwardly, and said second ends being received by a corresponding one of said sets of plated through holes, and
a plurality of right-angle mezzanine connectors mounted to said top surface in a row, each right-angle mezzanine connector having a plurality of second pins which are received by a corresponding one of said sets of plated through holes along said second surface of said transition card.

16. The bezel of claim 15 wherein said lower portion includes a plurality of walls which partition a space above said transition card assembly.

17. The bezel of claim 15 wherein said transition card is attached to said lower portion using nuts which are pressed into holes formed along a rear edge of said transition card, said rear edge being opposite a forward face of said right-angle mezzanine connectors.

18. The bezel of claim 15 wherein said lower portion includes a left-side lower portion and a right-side lower portion each attached to said handle portion, said transition card assembly being a first transition card assembly attached to said left-side lower portion, and further comprising a second transition card assembly attached to said right-side lower portion, said first and second transition card assemblies being maintained in spaced relation, and said first and second transition card assemblies being generally parallel and aligned.

19. A central electronic complex drawer for a computer system, comprising:
a chassis having two opposing sidewalls;
a generally horizontal motherboard mounted to said chassis, having a bottom surface, a top surface, and at least one straight forward edge;
an electronic interconnection assembly including
a plurality of right-angle edge connectors mounted to said bottom surface of said motherboard in a first row proximate said forward edge and parallel thereto, each right-angle edge connector providing electrical connections with a corresponding set of first connection points on said bottom surface of said motherboard, and having a first interconnect facing away from said forward edge in a direction which is generally orthogonal to said forward edge and generally parallel to said motherboard,
a plurality of vertical header connectors mounted to said top surface of said motherboard in a second row generally parallel to said first row proximate said forward edge and behind said right-angle edge connectors, each vertical header connector providing electrical connections with a corresponding set of second connection points on said top surface of said motherboard, and having a plurality of sockets facing away from said top surface of said motherboard,
a transition card having a bottom surface, a top surface, and a plurality of sets of plated through holes, said transition card disposed generally parallel to said motherboard,
a plurality of connector caps mounted to said bottom surface of said transition card in a third row generally parallel to said first and second rows, each connector cap retaining a plurality of first pins having first and second ends, said first ends being received by sockets of a corresponding one of said vertical header connectors, and said second ends being received by a corresponding one of said sets of plated through holes along said bottom surface of said transition card, said connector caps respectively engaging said vertical header connectors, and
a plurality of right-angle mezzanine connectors mounted to said top surface of said transition card, each right-angle mezzanine connector having a plurality of second pins which are received by a corresponding one of said sets of plated through holes along said top surface of said transition card, and having a second interconnect facing the direction which is generally orthogonal to said forward edge and generally parallel to said motherboard; and
a bezel which stabilizes said electronic interconnection assembly.

20. The central electronic complex drawer of claim 19 wherein said forward edge includes a left-side forward edge and a right-side forward edge, said electronic interconnection assembly being a first electronic interconnection assembly located along said left-side forward edge, and further comprising a second electronic interconnection assembly located along said right-side forward edge, wherein said bezel includes a handle portion, a left-side lower portion attached to said handle portion, and a right-side lower portion attached to said handle portion, said left-side lower portion being attached to said transition card of said first electronic interconnection assembly and said right-side lower portion being attached to another transition card of said second electronic interconnection assembly, said bezel maintaining said transition cards in spaced relation.

21. The central electronic complex drawer of claim 20 wherein said bezel has a length approximately equal to an interior width of said chassis as defined by said side walls.

22. The central electronic complex drawer of claim 19 wherein said right-angle edge connectors are cable connectors, and said right-angle mezzanine connectors are expansion card connectors.

23. The central electronic complex drawer of claim 22 wherein said cable connectors are symmetric multiprocessing bus (SMP) cable connectors, and said expansion card connectors are peripheral component interconnect express (PCIe) expansion card connectors.

24. An electronic interconnection assembly comprising:
a first circuit board having first and second opposing surfaces and at least one edge defining a forward area in front of said circuit board;
a first right-angle connector mounted to said first surface of said first circuit board proximate said edge, providing electrical connections with a first plurality of connection points on said first surface of said first circuit board, and having a first interconnect facing toward said forward area, said first right-angle connector being one of a first plurality of right-angle connectors mounted to said first surface of said first circuit board proximate said edge;
a header connector mounted to said second surface of said first circuit board proximate said edge, providing electrical connections with a second plurality of connection points on said second surface of said first circuit board, and having a first plurality of pins extending away from said second surface of said first circuit board, said header connector being one of a plurality of header connectors mounted to said second surface of said first circuit board proximate said edge;

a second circuit board having first and second opposing surfaces and a plurality of plated through holes which receive said first plurality of pins along said first surface of said second circuit board; and a second right-angle connector mounted to said second surface of said second circuit board having a second plurality of pins which are received by said plated through holes along said second surface of said second circuit board, and having a second interconnect facing toward said forward area, said second right-angle connector being one of a second plurality of right-angle connectors mounted to said second surface of said second circuit board.

* * * * *